US008356237B2

(12) United States Patent
Honda

(10) Patent No.: US 8,356,237 B2
(45) Date of Patent: Jan. 15, 2013

(54) CONTROLLER WITH ERROR CORRECTION FUNCTION, STORAGE DEVICE WITH ERROR CORRECTION FUNCTION, AND SYSTEM WITH ERROR CORRECTION FUNCTION

(75) Inventor: Toshiyuki Honda, Kyoto (JP)

(73) Assignee: Panasonic Corporation, Osaka (JP)

( * ) Notice: Subject to any disclaimer, the term of this patent is extended or adjusted under 35 U.S.C. 154(b) by 425 days.

(21) Appl. No.: 12/673,814

(22) PCT Filed: Jul. 27, 2009

(86) PCT No.: PCT/JP2009/003527
§ 371 (c)(1),
(2), (4) Date: Feb. 17, 2010

(87) PCT Pub. No.: WO2010/013437
PCT Pub. Date: Feb. 4, 2010

(65) Prior Publication Data
US 2011/0022928 A1 Jan. 27, 2011

(30) Foreign Application Priority Data
Jul. 30, 2008 (JP) .................................. 2008-195842

(51) Int. Cl.
*H03M 13/00* (2006.01)
(52) U.S. Cl. ...................................................... 714/785
(58) Field of Classification Search .................... 714/785
See application file for complete search history.

(56) References Cited

U.S. PATENT DOCUMENTS

| 5,933,436 A | 8/1999 | Tanzawa et al. |
| 6,425,046 B1 * | 7/2002 | Leung et al. ................... 711/101 |
| 6,487,685 B1 * | 11/2002 | Stuart Fiske et al. ......... 714/701 |
| 7,587,658 B1 * | 9/2009 | Tong et al. ..................... 714/785 |

(Continued)

FOREIGN PATENT DOCUMENTS

| JP | 8-255111 | 10/1996 |
| JP | 2008-102693 | 5/2008 |

OTHER PUBLICATIONS

Form PCT/ISA/237 for International Application No. PCT/JP2009/003527 dated Oct. 6, 2009 (English Translation).

(Continued)

*Primary Examiner* — Joshua Lohn
(74) *Attorney, Agent, or Firm* — Renner, Otto, Boisselle & Sklar, LLP

(57) ABSTRACT

The invention is intended to curtail the circuit scale of the error correction circuit of a flash memory. The invention relates to a controller with error correction function capable of controlling writing and reading of data in a plurality of memories, including a buffer memory, an error correction circuit, and a plurality of interface modules provided individually corresponding to each one of the plurality of memories, for exchanging data with the memories, in which the plurality of interface modules have a plurality of syndrome generation function parts for receiving sector data from the memories and error correction codes corresponding to the sector data, and generating syndromes on the basis of the received sector data and error correction codes, the buffer memory temporarily stores the plurality of sector data, and the error correction circuit determines the address having an error corresponding to each one of the syndromes generated by the plurality of syndrome generation function parts, and corrects the bit corresponding to such address in the sector data stored in the buffer memory.

9 Claims, 11 Drawing Sheets

U.S. PATENT DOCUMENTS

| | | | |
|---|---|---|---|
| 2004/0153902 A1* | 8/2004 | Machado et al. | 714/710 |
| 2004/0177312 A1* | 9/2004 | Xin | 714/782 |
| 2005/0249010 A1* | 11/2005 | Klein | 365/222 |
| 2007/0226597 A1* | 9/2007 | Taito et al. | 714/785 |
| 2007/0268905 A1* | 11/2007 | Baker et al. | 370/392 |
| 2008/0094898 A1* | 4/2008 | Nakano et al. | 365/185.09 |
| 2009/0024884 A1* | 1/2009 | Klein | 714/718 |
| 2009/0106633 A1* | 4/2009 | Fujiwara et al. | 714/785 |
| 2010/0293438 A1* | 11/2010 | Lastras-Montano et al. | 714/763 |
| 2011/0022928 A1* | 1/2011 | Honda | 714/763 |

OTHER PUBLICATIONS

International Search Report for corresponding application No. PCT/JP2009/003527 dated Oct. 6, 2009.

Form PCT/ISA/237.

* cited by examiner

Fig.11

| CIRCUIT BLOCK | CIRCUIT SCALE (RATIOS OF ERROR CODE GENERATION FUNCTION PART, SYNDROME GENERATION FUNCTION PART, AND ERROR CORRECTION FUNCTION PART IN AN ECC CIRCUIT MOUNTING A READ-SOLOMON CODE CAPABLE OF CORRECTING BY 4 BYTES PER 528 BYTES) |
|---|---|
| ERROR CODE GENERATION FUNCTION PART | 1 |
| SYNDROME GENERATION FUNCTION PART | 2 |
| ERROR CORRECTION FUNCTION PART | ~10 |

CONTROLLER WITH ERROR CORRECTION FUNCTION, STORAGE DEVICE WITH ERROR CORRECTION FUNCTION, AND SYSTEM WITH ERROR CORRECTION FUNCTION

TECHNICAL FIELD

The present invention relates to a controller having an error correction function for a memory requiring error correction such as a flash memory, a storage device having an error correction function for such a memory, and a system having an error correction function using such a storage device.

BACKGROUND ART

Recently, the memory card as a nonvolatile storage device mounting a flash memory of NAND type that is a nonvolatile memory as a programmable semiconductor device is expanding its market size as a storage medium for digital cameras and mobile telephones. Further, as an inexpensive storage device, aside from a memory card, for example, applications are expanding in HDD replacing SSD, memories to be mounted directly on host devices, etc.

At the same time, in the recent trend of downsizing of semiconductor device and process, the storage capacity has been increasing rapidly. The increase of storage capacity leads to increase of quantity of data to be stored in the storage medium. The increase of data capacity leads to demand for shortening of reading and writing time for the sake of convenience of access to the data.

On the other hand, downsizing of process has other effects, such as decline of reliability of flash memory. As the flash memory becomes smaller, the number of electrons for storing information decreases. It leads to various deterioration factors, such as retention, read disturb, and program disturb. It is hence generally proposed to enhance the reliability of the storage device using a flash memory by mounting an error correction function.

FIG. 9 is a block diagram of an example of nonvolatile storage device of a conventional storage device. Referring to FIG. 9, an application situation of error correction function is explained. A nonvolatile storage device 901 shown in FIG. 9 is composed of a controller 902 having an error correction function, and a nonvolatile memory 903. The nonvolatile storage device 901 is capable of writing or reading data from outside by specifying an address, and stores the written data without losing. The nonvolatile memory 903 is a memory for storing the data written in the nonvolatile storage device 901 within the nonvolatile storage device 901.

The controller 902 is composed of a host I/F (interface) 904, a buffer memory 905, and a memory I/F (interface) module 906. The buffer memory 905 is composed of a plurality of data buffers 907. The individual data buffers 907 can store data for the portion of one sector (512 bytes) each.

The memory I/F module 906 is composed of a memory I/F (interface) 909, an error code generation function part 910, a syndrome generation function part 911, an error position detection circuit 912, and an error correction circuit 913. The memory I/F module 906 transfers data between the corresponding nonvolatile memory 903 and buffer memory 905. The error code generation function part 910 generates an error correction code corresponding to the data to be written when writing data into the nonvolatile memory 903. The error correction code generated in the error code generation function part 910 is written into the corresponding nonvolatile memory 903 by way of the memory I/F 909.

The syndrome generation function part 911 reads out data and the corresponding error correction code and calculates the syndrome when the data is read out from the nonvolatile memory 903. The calculation result by the syndrome generation function part 911 is sent to the error position detection circuit 912. The error position detection circuit 912 calculates and determines the address position of the data having the error, on the basis of the syndrome sent from the syndrome generation function part 911. The error correction circuit 913 reads out the data of the address position determined by calculation in the error position detection circuit 912 from the data buffer 907, corrects the error, and writes back into the data buffer 907.

FIG. 10 is a block diagram of another example of nonvolatile storage device of a conventional storage device. The nonvolatile storage device shown in FIG. 10 has a plurality of nonvolatile memories connected to a plurality of I/Fs. The nonvolatile storage device shown in FIG. 10 controls the plurality of nonvolatile memories of the plurality of I/Fs. That is, since the plurality of I/Fs operate simultaneously, there are also a plurality of memory I/F modules, so that generation of error code and calculation of syndrome are executed in parallel.

As mentioned above, it is a generally known technique to enhance the reliability of flash memory by using such error correction function part. However, since the flash memory itself is lowered in reliability, an error correction circuit of higher performance and large error correction capacity is needed.

FIG. 11 is a table showing an example of circuit scale of error correction circuit in a conventional nonvolatile storage device. The numerical values shown in FIG. 11 show the ratio of error code generation function part, syndrome generation function part, and error correction function part in a circuit mounting a Read-Solomon code capable of correcting by 4 bytes per 528 bytes. As clear from the table in FIG. 11, the circuit scale of the error correction function part is larger than others.

The circuit scale of the error code generation function part and syndrome generation function part increases nearly in proportion to the number of bits of ECC code, but the error correction function part is an arithmetic unit, and if attempted to enhance the error correction capacity, the circuit scale increases rapidly.

The error code generation and the syndrome generation are executed simultaneously with data transfer to the nonvolatile memory. However, the error correction is processed independently after transfer, and its arithmetic processing speed has a direct effect on the entire processing speed of the storage device. From such viewpoint, too, the processing speed of error correction is demanded to be enhanced. However, increase of processing speed results in increase in circuit scale.

Patent document 1: Japanese Patent Application Laid-Open No. 10-145238

DISCLOSURE OF THE INVENTION

As mentioned above, the error correction circuit is necessary for maintaining and enhancing the reliability of flash memory, but increase of its error correction capacity leads to increase of circuit scale. It is hence an object of the invention to curtail the circuit scale while maintaining the high error correction capacity of the error correction circuit.

To achieve the object, the controller with error correction function of the invention is a controller with error correction function capable of controlling writing and reading of data in a plurality of memories, including:

a buffer memory, an error correction circuit, and a plurality of interface modules provided individually corresponding to each one of the plurality of memories, for exchanging data with the memories, in which the plurality of interface modules have a plurality of syndrome generation function parts for receiving sector data from the memories and error correction codes corresponding to the sector data, and generating syndromes on the basis of the received sector data and error correction codes, the buffer memory temporarily stores the plurality of sector data, and the error correction circuit determines the address having an error corresponding to each one of the syndromes generated by the plurality of syndrome generation function parts, and corrects the bit corresponding to such address in the sector data stored in the buffer memory.

To achieve the object, the storage device with error correction function of the invention is a storage device with error correction function composed of a controller with error correction function and a plurality of memories, the controller with error correction function being a controller with error correction function capable of controlling writing and reading of data in the plurality of memories, including:

a buffer memory, an error correction circuit, and a plurality of interface modules provided individually corresponding to each one of the plurality of memories, for exchanging data with the memories, in which the plurality of interface modules have a plurality of syndrome generation function parts for receiving sector data from the memories and error correction codes corresponding to the sector data, and generating syndromes on the basis of the received sector data and error correction codes, the buffer memory temporarily stores the plurality of sector data, and the error correction circuit determines the address having an error corresponding to each one of the syndromes generated by the plurality of syndrome generation function parts, and corrects the bit corresponding to such address in the sector data stored in the buffer memory.

To achieve the object, the system with error correction function of the invention is a system with error correction function composed of a storage device with error correction function and a host device, the storage device with error correction function being a storage device with error correction function composed of a controller with error correction function and a plurality of memories, the controller with error correction function being a controller with error correction function capable of controlling writing and reading of data in the plurality of memories, including:

a buffer memory, an error correction circuit, and a plurality of interface modules provided individually corresponding to each one of the plurality of memories, for exchanging data with the memories, in which the plurality of interface modules have a plurality of syndrome generation function parts for receiving sector data from the memories and error correction codes corresponding to the sector data, and generating syndromes on the basis of the received sector data and error correction codes, the buffer memory temporarily stores the plurality of sector data, and the error correction circuit determines the address having an error corresponding to each one of the syndromes generated by the plurality of syndrome generation function parts, and corrects the bit corresponding to such address in the sector data stored in the buffer memory.

According to the invention, in the nonvolatile storage device, a part of the function of error correction circuit is shared by a plurality of I/Fs, but the correction function of the error correction function is not lowered, and the circuit scale is further curtailed, and finally the cost of the controller and storage device can be lowered.

BRIEF DESCRIPTION OF DRAWINGS

FIG. 11 is a table showing an example of circuit scale of error correction device of a conventional nonvolatile storage device.

DESCRIPTION OF REFERENCE NUMERALS

Figure 1:
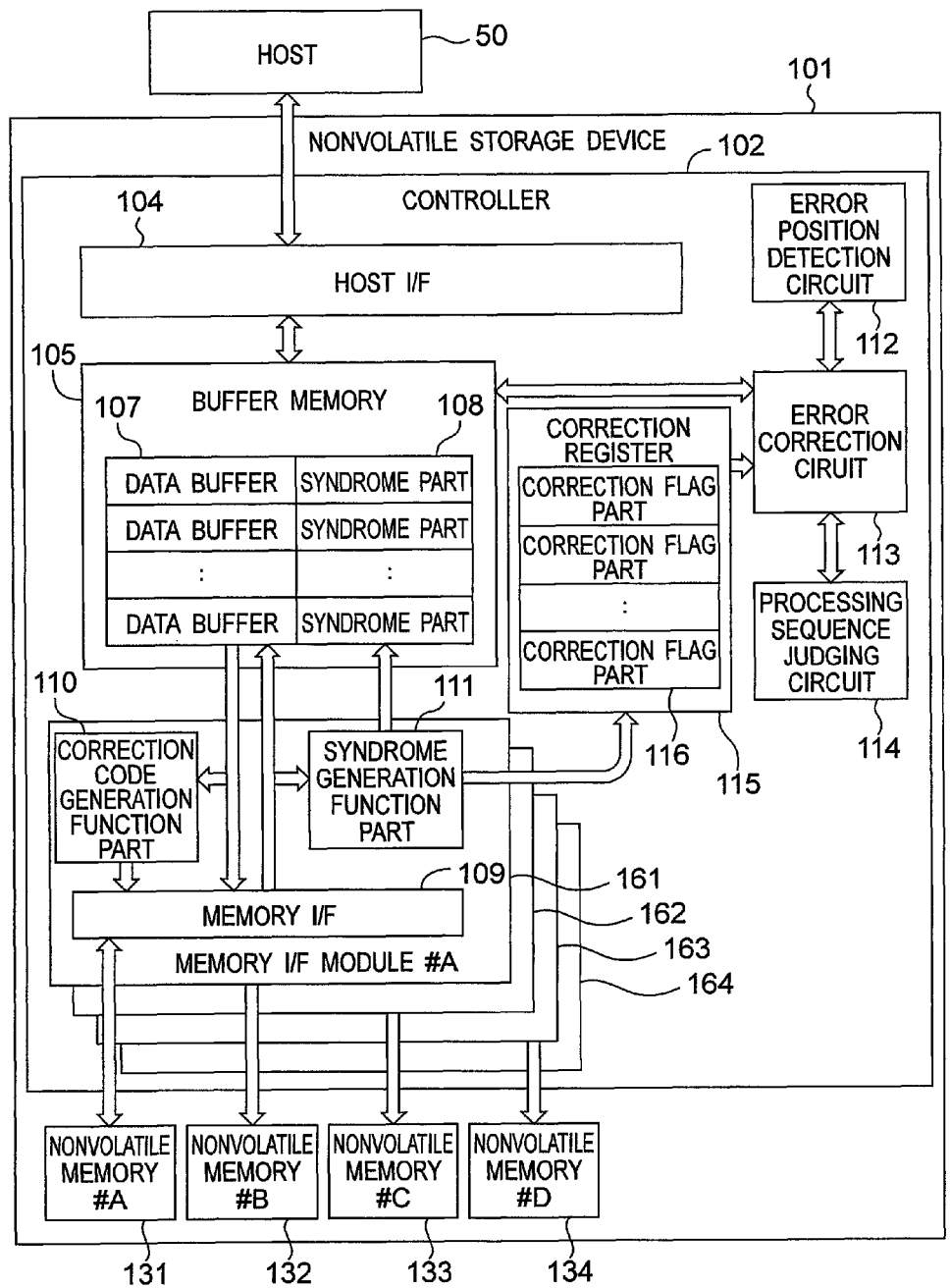
FIG. 1 is a block diagram of nonvolatile storage device with error correction function in a first preferred embodiment of the invention.

101 Nonvolatile storage device
102 Controller
131 Nonvolatile memory #A
132 Nonvolatile memory #B
133 Nonvolatile memory #C
134 Nonvolatile memory #D
104 Host I/F
105 Buffer memory
161 Memory I/F module #A 162 Memory I/F module #B
163 Memory I/F module #C
164 Memory I/F module #D
107 Data buffer
108 Syndrome part
109 Memory I/F
110 Correction code generation function part
111 Syndrome generation function part
112 Error position detection circuit
113 Error correction circuit
114 Processing sequence judging circuit
115 Correction register
116 Correction flag part
901 Nonvolatile storage device
902 Controller
903 Nonvolatile memory
904 Host I/F
905 Buffer memory
906 Memory I/F module
907 Data buffer
909 Memory I/F
910 Correction code generation function part
911 Syndrome generation function part
912 Error position detection circuit
913 Error correction circuit

BEST MODE FOR CARRYING OUT THE INVENTION

First Preferred Embodiment

Preferred embodiments of the invention are described below while referring to the accompanying drawings.

FIG. 1 is a block diagram of a nonvolatile storage device 101 with error correction function in a first preferred embodiment of the invention. The block diagram also shows outline of flow of data.

The nonvolatile storage device 101 shown in FIG. 1 is roughly composed of a controller 102 having error correction function, a nonvolatile memory #A131, a nonvolatile memory #B132, a nonvolatile memory #C133, and a nonvolatile memory #D134. The nonvolatile storage device 101 is capable of writing and reading data from outside after specifying an address, and the written data is nonvolatile and stored. The nonvolatile memories #A131 to #D134 are memories for storing data written into the nonvolatile storage device 101. The nonvolatile storage device 101 is controlled by a host 50 for writing and reading of data.

The controller 102 has a host I/F 104 for exchanging commands and data with the host 50. The controller 102 is composed of a buffer memory 105, a memory I/F module #A161, a memory I/F module #B162, a memory I/F module #C163, a memory I/F module #D164, an error position detection circuit 112, an error correction circuit 113, a processing sequence judging circuit 114, and a correction register 115. Herein, the reason of having the plurality of nonvolatile memories #A131 to #D134 is intended to enhance the performance of writing of data into the nonvolatile storage device 101 and reading of data from the nonvolatile storage device 101 by parallel operation of the plurality of nonvolatile memories. In each nonvolatile memory, generally, data is stored recursively and sequentially.

The buffer memory 105 is composed of a plurality of data buffers 107, and syndrome parts 108 corresponding to individual data buffers 107. The individual data buffers 107 can store data for the portion of one sector (512 bytes). The individual syndrome parts 108 store the results of syndrome calculation of data of one sector of the corresponding data buffers 107 and error correction codes corresponding to the data being read out from the nonvolatile memories #A131 to #D134 (by a syndrome generation function part 111 described below).

The memory I/F modules #A161 to #D164 are individually composed of memory I/F 109, correction code generation function part 110, and syndrome generation function part 111. The memory I/F 109 transfers data between the corresponding nonvolatile memories #A131 to #D134 and the buffer memory 105. The correction code generation function part 110 generates an error correction code corresponding to the data to write in when writing data into the nonvolatile memories #A131 to #D134. The error correction signal generated in the correction code generation function part 110 is written into the corresponding nonvolatile memories #A131 to #D134 by way of the memory I/F 109.

The syndrome generation function part 111 calculates the syndrome by reading out the data and the corresponding error correction codes when reading out data from the nonvolatile memories #A131 to #D134. The result of calculation in the syndrome generation function part 111 is stored in the syndrome part 108 in the buffer memory 105.

The correction register 115 includes a plurality of correction flag parts 116, and information showing whether error correction is necessary or not is stored in the correction flag parts 116. The individual correction flag parts 116 correspond to the data buffers 107 and the syndrome parts 108 of the buffer memory 105. That is, the data buffer 107, the syndrome part 108, and the correction flag parts 116 compose a set. Therefore, when data of one sector is read out from the nonvolatile memories #A131 to #D134, about the data of each sector, the data buffer 107 stores the data of the sector, the syndrome part 108 stores the syndrome corresponding to the data of the sector, and the correction flag part 116 stores information showing necessity or no necessity of correcting the data of the sector.

The error position detection circuit 112 reads out the syndrome from the syndrome part 108 of the buffer memory 105 by way of the error correction circuit 113, and calculates the address of the bit having an error. The error correction circuit 113 confirms the correction flag part 116 of the correction register 115 on the basis of the judging result by the processing sequence judging circuit 114, and reads out the syndrome from the syndrome part 108 of the buffer memory 105 as for the sector requiring correction, and transfers to the error position detection circuit 112, and reads out the data and corrects and writes back into the data buffer 107, at the address of the bit having an error shown as a result of operation in the error position detection circuit 112 in the data buffer 107 of the buffer memory 105. Thus, in the semiconductor storage device in the first preferred embodiment of the invention, the information from the syndrome generation function part 111 of the plurality of memory I/F modules #A161 to #D164 is summarized in the correction register 115, and the error correction circuit 113 refers to the summarized information, and corrects errors sequentially.

Figure 2:
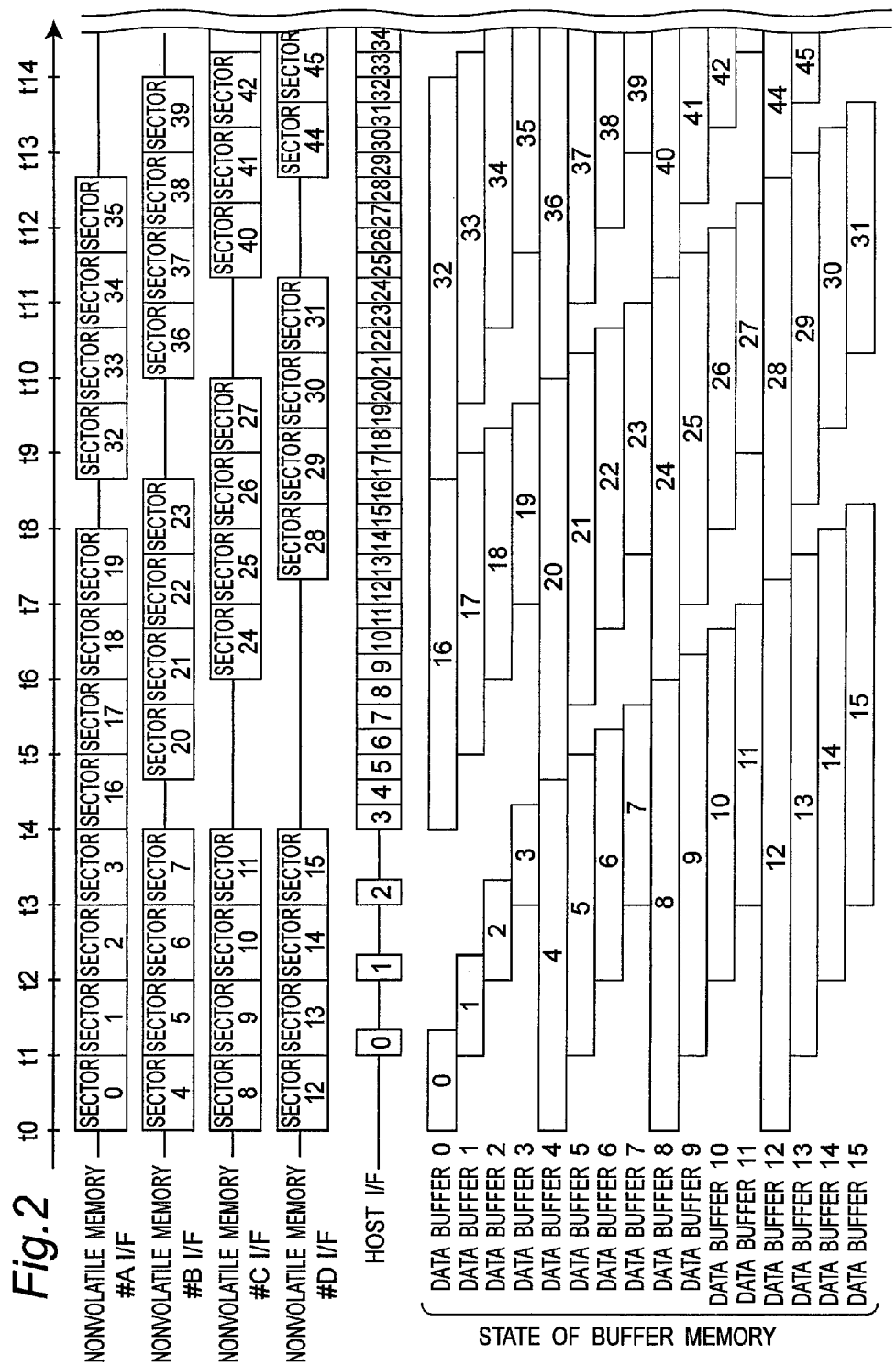
FIG. 2 is an example of timing chart of data reading of nonvolatile storage device in the first preferred embodiment of the invention.

FIG. 2 shows an example of timing chart of data reading in the nonvolatile storage device in the first preferred embodiment of the invention. FIG. 2 is a timing chart free from an error in the data stored in the nonvolatile memory.

In FIG. 2, first of all, "nonvolatile memory #A I/F" is a signal of I/F for reading out data from the nonvolatile memory #A131, "nonvolatile memory #B I/F" is a signal of I/F for reading out data from the nonvolatile memory #B132, "nonvolatile memory #0 I/F" is a signal of I/F for reading out data from the nonvolatile memory #0133, and "nonvolatile memory #D I/F" is a signal of I/F for reading out data from the nonvolatile memory #D 134. "Host I/F" is a signal of I/F for reading out data from the host I/F 104 to the host 50 of outside.

Further, "state of buffer memory" shows the state from storing of the data being read out from the nonvolatile memories #A131 to #D134 into individual data buffers 107 of the buffer memory 105, until output of the data outside into the nonvolatile storage device 101 by way of the host I/F 104. In the buffer memory 105 of the first preferred embodiment, sixteen data buffers (data buffer 0 to data buffer 15) are provided, and each data is supposed to be stored in the data buffer of the number corresponding to the remainder after division of the address from outside of the nonvolatile storage device 101 by 16. That is, data of address 0 is stored in the data buffer 0, data of address 1 is stored in the data buffer 1, data of address 16 is stored in the data buffer 0 (16/16=1, therefore, the remainder is 0), and data of address 100 is stored in the data buffer 4 (100/16=6, therefore, the remainder is 4).

Figure 5:
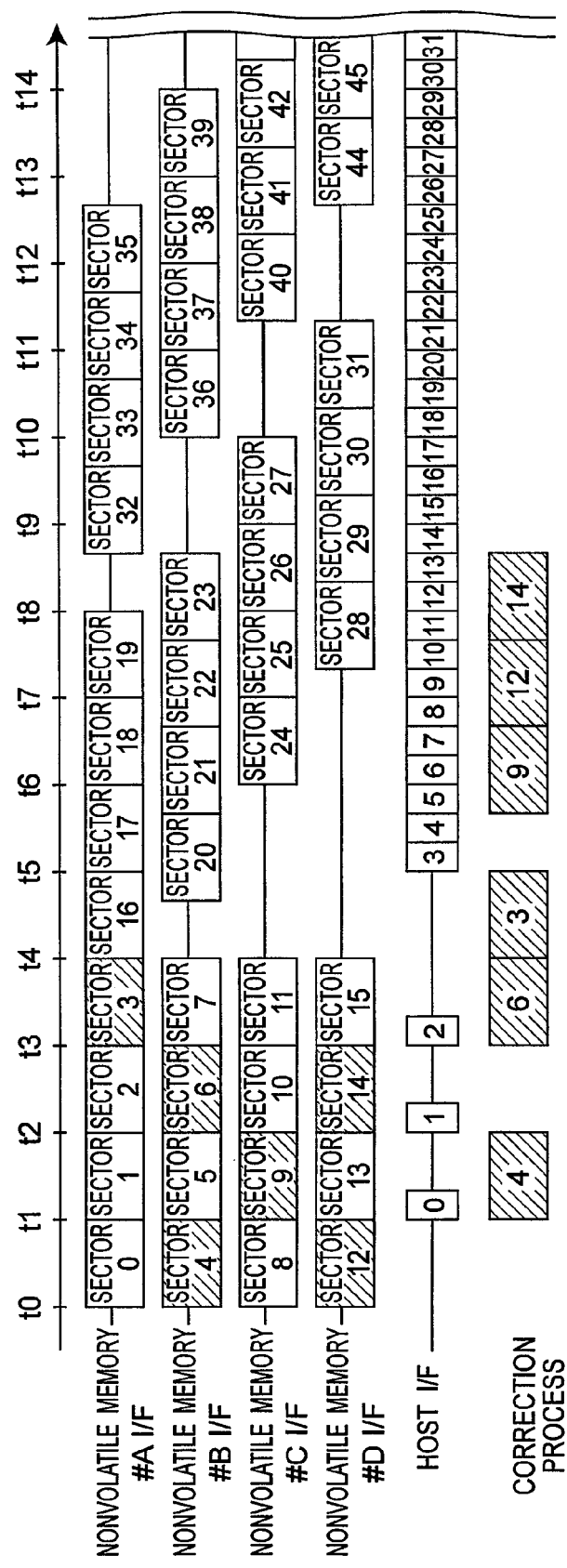
FIG. 5 is another example of timing chart of data reading of nonvolatile storage device in the first preferred embodiment of the invention, being an example of scheduling. This is also an example of timing chart in the case of occurrence of error in the data stored in a nonvolatile memory.
Figure 6:
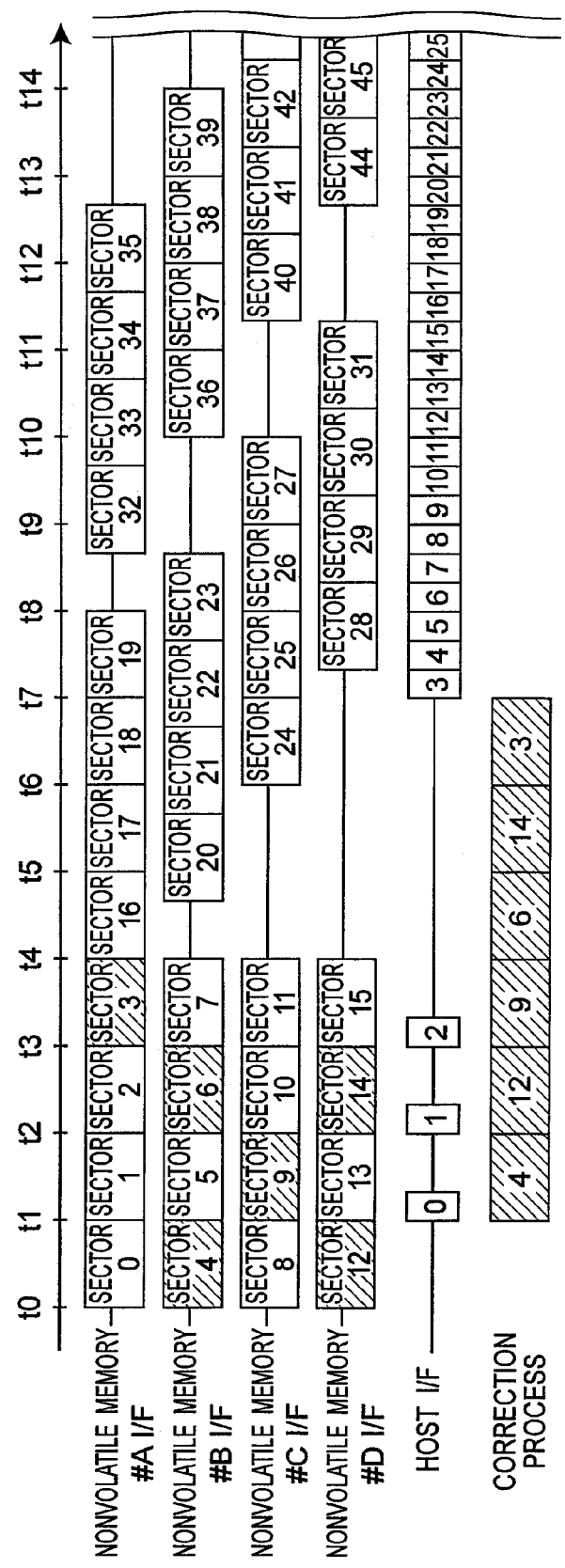
FIG. 6 is another example of timing chart of data reading of nonvolatile storage device in the first preferred embodiment of the invention, being an example of not scheduling. This is also an example of timing chart in the case of occurrence of error in the data stored in a nonvolatile memory.

The highest portion of the timing chart of FIG. 2 shows the flow of the time (same in the other timing charts in FIG. 5 and FIG. 6).

Referring now to FIG. 1 and FIG. 2, in the absence of error in the data stored in the nonvolatile memory, the operation of the storage device with error correction function (when reading out) in the first preferred embodiment of the invention is explained below.

First, at time t0, the host outside of the nonvolatile storage device 101 issues a read command of data specified in address, and the data corresponding to the address, and the data of address after this data is read out from the nonvolatile memories #A131 to #D134, and the transfer is started. In this explanation, it is based on the principle that the writing size of the data of flash memory of NAND type as a general nonvolatile memory is 2K bytes, and therefore in the nonvolatile memories #A131 to #D134, data is allocated and stored recursively and sequentially in every four sectors (=2K bytes/512 bytes).

Therefore, data of sector 0 is read out from the nonvolatile memory #A131, data of sector 4 is read out from the nonvolatile memory #3132, data of sector 8 is read out from the nonvolatile memory #C133, and data of sector 12 is read out from the nonvolatile memory #D134, and are respectively stored in the corresponding data buffers 107 (that is, data buffer 0, data buffer 4, data buffer 8, and data buffer 12) of the buffer memory 105 by way of individual memory I/F 109. At this time, on the basis of the data and the error correction codes being read out from the nonvolatile memories #A131 to #D134, the syndrome is calculated in each syndrome generation function part 111, and the results of calculating operations are stored in the corresponding syndrome parts 108 and correction flag parts 116.

Next, at time t1, data of sector 1 is read out from the nonvolatile memory #A131, data of sector 5 is read out from the nonvolatile memory #B132, data of sector 9 is read out from the nonvolatile memory #C133, and data of sector 13 is read out from the nonvolatile memory #D134, and are respectively stored in the corresponding data buffers 107 (that is, data buffer 1, data buffer 5, data buffer 9, and data buffer 13) of the buffer memory 105 by way of individual memory I/F 109. At this time, in the same manner as at time t0, on the basis of the data and the error correction codes being read out from the nonvolatile memories #A131 to #D134, the syndrome is calculated in each syndrome generation function part 111, and the results of calculating operations are stored in the corresponding syndrome parts 108 and correction flag parts 116. Since the data of sector 0 is stored in data buffer 0, at the same time t1, the data is sent out of the nonvolatile storage device by way of the host I/F 104.

Next, at time t2, data of sector 2 is read out from the nonvolatile memory #A131, data of sector 6 is read out from the nonvolatile memory #B132, data of sector 10 is read out from the nonvolatile memory #C133, and data of sector 14 is read out from the nonvolatile memory #D134, and are respectively stored in the corresponding data buffers 107 (that is, data buffer 2, data buffer 6, data buffer 10, and data buffer 14) of the buffer memory 105 by way of individual memory I/F 109. At this time, in the same manner as at time t0, or t1, on the basis of the data and the error correction codes being read out from the nonvolatile memories #A131 to #D134, the syndrome is calculated in each syndrome generation function part 111, and the results of calculating operations are stored in the corresponding syndrome parts 108 and correction flag parts 116. Since the data of sector 1 is stored in data buffer 1, at the same time t2, the data is sent out of the nonvolatile storage device by way of the host I/F 104.

Hereinafter, in the same sequence, the data from the nonvolatile memories #A131 to #D134 are read out into the buffer memory 105 individually by way of the memory I/F 109, and sent out of the nonvolatile storage device 101 by way of the host I/F 104.

At time t4, the data of sectors 3 to 15 are stored in the data buffers 3 to 15, the individual data are sent out of the nonvolatile storage device 101 sequentially and continuously by way of the host I/F 104. At the same time, at time t4, the data of sector 0 having stored in data buffer 0 for storing sector 16 has been already sent out, and therefore the data of sector 16 can be successively read out from the nonvolatile memory #A131. However, in data buffers 4, 8, 12 for storing sectors 20, 24, 28, the data of sectors 4, 8, 12 are still remaining in the nonvolatile storage device 101. Therefore, at this time, the data cannot be read out into the buffer memory 105 from the nonvolatile memories #B132 to #D134. However, after the data stored in the corresponding data buffers are sent out of the nonvolatile storage device 101, they can be read out sequentially.

As mentioned above, FIG. 2 shows a timing chart free from an error in the data stored in the nonvolatile memories, but when reading out the data to outside of the nonvolatile storage device 101, the processing sequence judging circuit 114 is always monitoring the address of the data transferred to outside of the nonvolatile storage device 101 by the host I/F 104, and the address of the data being read out into the buffer memory 108 by the memory I/F 109, and is informing the error correction circuit 113 of the range of error correction applicable addresses. The error correction circuit 113 recognizes the correction flag part 116 in the correction register 115 according to the range of error correction applicable addresses noticed from the processing sequence judging circuit 114, and corrects the error of the corresponding sector if data requiring error correction is stored (in this case, however, it is supposed that an error is not present).

FIG. 5 and FIG. 6 show other examples of timing chart of data reading of nonvolatile storage device in the first preferred embodiment of the invention, in which errors are contained in the data stored in the nonvolatile memories. Prior to explanation, the flow of error correction in the nonvolatile storage device in the first preferred embodiment of the invention is explained by referring to the flowchart of processing of error correction function of the controller 102 in the nonvolatile storage device 101 shown in FIG. 3.

When reading out data from the nonvolatile storage device 101, as mentioned above, the processing sequence judging circuit 114 is always monitoring the address of the sectors sent out by way of the host I/F 104. This operation is shown at step 301. At step 301, the address (supposing HAM) to be read out by the host 50 is acquired.

At next step 302, the error recognition region is determined. In other words, in the same manner as at step 301, this operation is executed by the processing sequence judging circuit 114, and the region of addresses adding n sectors to the addresses of the data being read out into the host by way of the host I/F 104, that is, the region from HADR to HADR+n is determined.

At next step 303, correction flag check of error recognition region is executed. Herein, the error correction circuit 113 checks the correction flag part 116 in the correction register 115 corresponding to the range of error recognition region (HADR to HADR+n) noticed from the processing sequence judging circuit 114. If the correction flag parts 116 in the correction register 115 do not contain information showing necessity of error correction, the operation returns to step 301. (As shown in the timing chart of FIG. 2, if an error is not present, these steps, step 301, step 302, and step 303, will be repeated recursively.) If the information showing necessity of error correction is contained in the correction flag part 116 in the correction register 115, the operation goes to step 304.

At step 304, a minimum address of an error sector is acquired. That is, the error correction circuit 113 determines the address of the sector of the smallest address, among the correction flag parts 116 in which storage of information of necessity of error correction has been checked at step 303.

At next step 305, the error correction circuit 113 reads out the syndrome corresponding to the address determined at step 304 from the syndrome part 108, and transfers to the error position detection circuit 112, which executes the calculation for determining the address of the bit having an error. The error position detection circuit 112 determines the address of the bit having an error on the basis of the transferred syndrome, and notices to the error correction circuit 113. In the error correction circuit 113, the data is read out from the data buffer 107 on the basis of the address of the bit having an error noticed from the error position detection circuit 112, and the error is corrected, and the data is written back. Then the operation returns to step 301 for next error correction.

Thus, in the period of step group 306 from step 301 to 305, when reading from the nonvolatile storage device 101 is completed, the processing is terminated.

Figure 4:
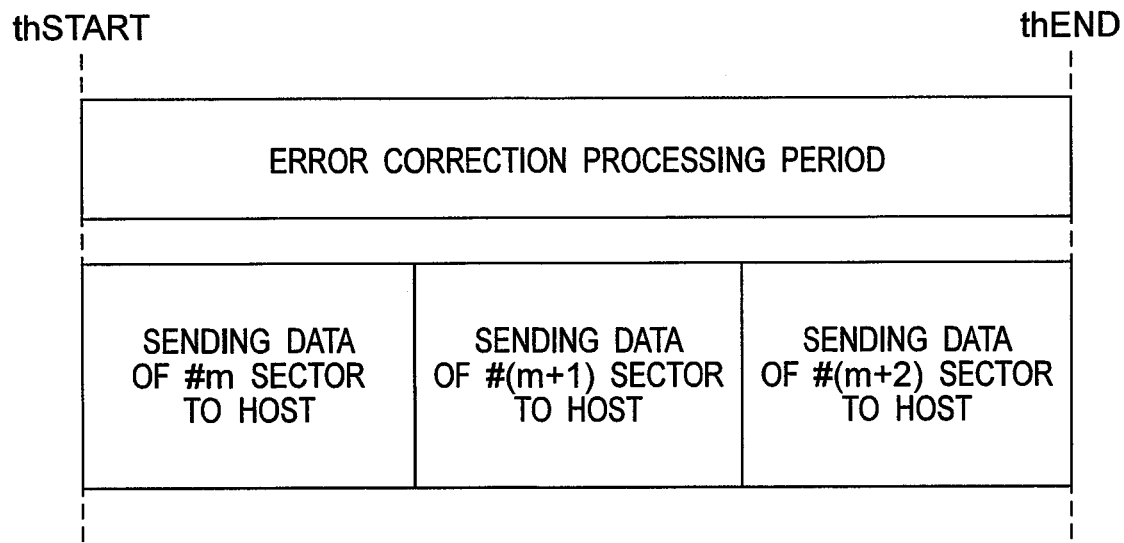
FIG. 4 is a diagram expressing the relation of error correction processing time and data transfer time to the host of nonvolatile storage device in the first preferred embodiment of the invention.

Successively, according to this flow chart, the reason of setting the error recognition region (n sectors) is described by referring to FIG. 4.

In the nonvolatile storage device having a plurality of memory I/Fs, each of them being with a nonvolatile memory as shown in FIG. 1, for transferring data simultaneously by a plurality of memory I/Fs, the sector data being read out from the nonvolatile memory into the controller are often not in the address sequence. For example, between sector 3 and sector 4 in the timing chart in FIG. 2, sector 4 is read out ahead. In this case, too, in the data output to the host, the sequence of addresses must be maintained. Hence, if there is only one error correction circuit for a plurality of I/Fs with a nonvolatile memory (that is, in the case as shown in FIG. 1), the sequence of error correction must be controlled.

Figure 3:
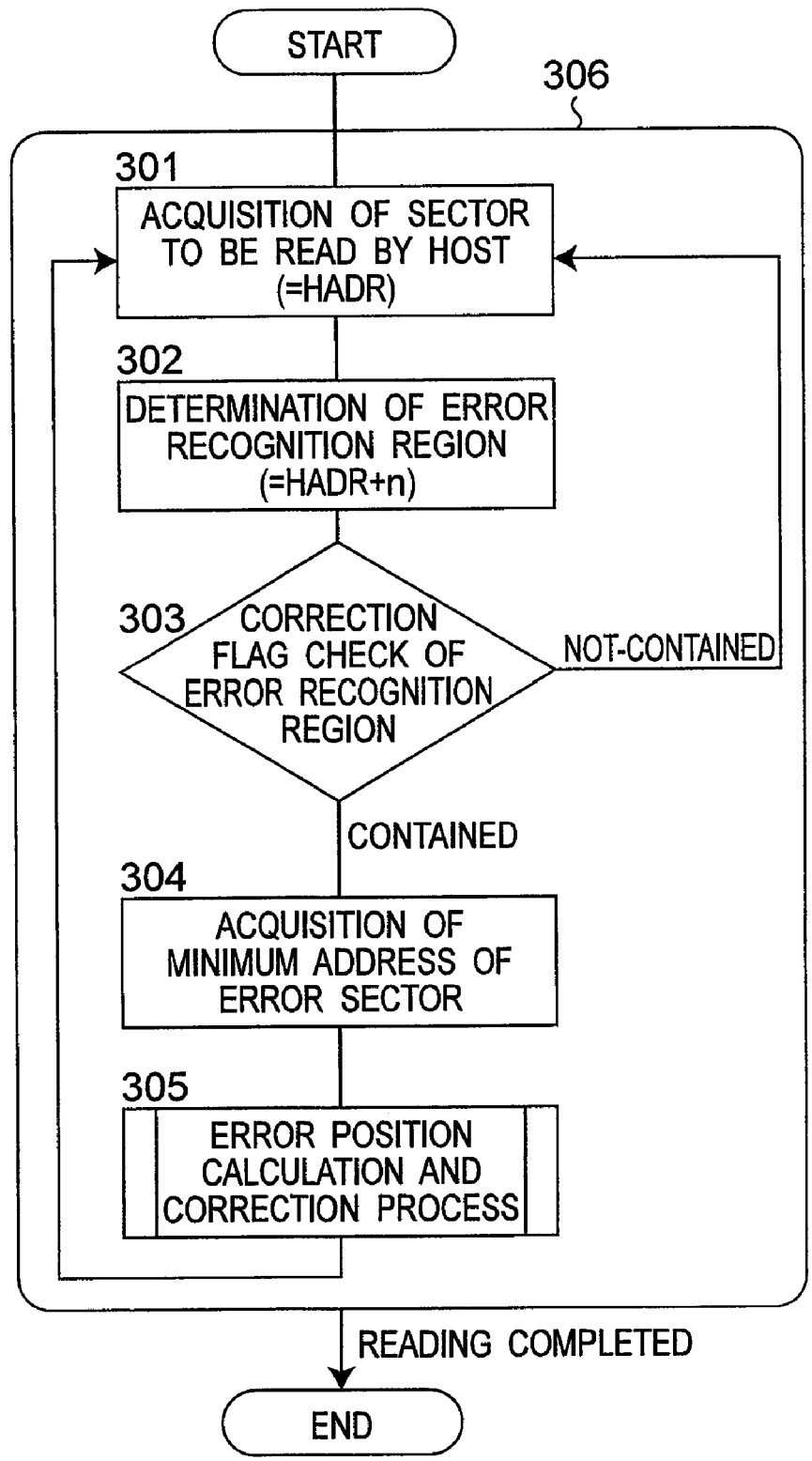
FIG. 3 is a flowchart of processing of error correction function of controller of nonvolatile storage device in the first preferred embodiment of the invention.

Accordingly, FIG. 4 is a diagram showing an example of discussion about processing time for determining n sectors of the addition portion of error recognition region (HADR+n) included in the flowchart shown in FIG. 3. As shown in FIG. 4, in this case, the error correction processing time for error correction process is longer than the period of data transfer of one sector portion to the host (that is, an ordinary case).

The start time of error correction processing period is supposed to be thSTART, and the end time is thEND. The output time of sector data to the host is shorter than the time from thSTART to thEND, and data of three sectors can be transferred in a period from thSTART to thEND, that is, m sector, (m+1) sector, and (m+2) sector (m being a natural number). In this case, suppose that an error requiring correction occurs in one sector, and that the sector is (m+3) sector. Hence, at the timing of thEND, it is required to send the data of (m+3) sector to the host, to send out the data of (m+3) sector without delay, it is necessary to start the error correction processing of (m+3) sector at a timing of thSTART or an earlier timing. Therefore, it is appropriate to set 4 or more as the number of n (sector).

In the case above, it is supposed that an error has occurred only in (m+3) sector, that is, the frequency of occurrence of errors is low, but if the frequency of occurrence of errors is high, and error correction is required frequently, the value of n must be set larger. However, if the value of n is too large, correction will be processed in the error occurrence sequence. That is, it is often likely to correct the error of the data later to be issued to the host earlier than the data first to be issued to the host, and it sequentially leads to a cause of lowering of reading speed to the host.

FIG. 5 is an example of timing chart of data reading in the nonvolatile storage device in the first preferred embodiment of the invention, supposing n=4. FIG. 5 is a timing chart in the presence of an error when reading out nearly same data as the data in FIG. 2.

In the nonvolatile memory #A I/F to #D I/F in FIG. 5, the hatching area shows the sectors having errors. At time t0, reading data out of the nonvolatile memories #A131 to #D143 starts. At this time, data is not sent out yet to the host, and the value of HADR is sector 0 (when data is not sent out to the host, HADR takes the value of the sector next to be sent out to the host). Since HADR is 0, in the case of n=4, occurrence of errors is judged in data of up to four sectors. That is, the processing sequence judging circuit 114 notices the range of error recognition region of sector 0 to sector 4 to the error correction circuit 113, and the error correction circuit 113 checks the correction flag parts 116 in the correction register 115 corresponding to the range of sector 0 to sector 4.

In the period from t0 to t1, there are errors in the data of sector 4 of the nonvolatile memory #B132 and in the data of sector 12 of the nonvolatile memory #D134, but occurrence of errors can be recognized only after the calculation of syndrome, so far the steps of steps 301 to 303 are looped.

In succession, at time t1, on the basis of the data and correction code of the nonvolatile memory #B132, the syndrome generation function part 111 of the memory I/F module #B162 having generated the syndrome detects an error in sector 4 from the syndrome, and the syndrome result is stored in the corresponding syndrome part 108, and the information showing necessity of error correction is stored in the corresponding correction flag part 116. Similarly, the syndrome generation function part 111 of the memory I/F module #D164 detects an error in sector 12, and writes into the corresponding syndrome part 108, and correction flag part 116. Similarly, at time t1, the error correction circuit 113 confirms, at step 303, the information showing necessity of error correction in the correction flag part 116 corresponding to sector 4. At step 304, the correction circuit 113 acquires the address of minimum sector among the sectors requiring error correction, or sector 4 herein, and executes the error correction at step 305. Similarly, hereinafter, errors are corrected in the error recognition region of the range of host reading sector+4 sectors.

By scheduling error correction in this manner, the number of error correction circuits can be smaller than the number of memory I/Fs, so that the circuit scale can be curtailed.

In FIG. 6, errors occur similarly as in FIG. 5, but this is an example of timing chart of data reading in the nonvolatile storage device in the first preferred embodiment of the invention, in which error recognition region is not set. When the "error recognition region is not set," errors are corrected in the sequence of occurrence of errors. More specifically, there is a judging rule, that is, if sector data having an error is checked while error correction is not executed, the sector data of the earliest address among the sector data having errors is corrected of errors at this moment. This judging rule is not appropriate in scheduling as compared with the flowchart shown in FIG. 3, and the data reading performance to the host shown in FIG. 6 is slightly lower as compared with the case in FIG. 5. However, in the case FIG. 6, too, since there is one error correction circuit in a plurality of memory I/Fs, the circuit scale is curtailed.

Second Preferred Embodiment

Successively, while referring to the accompanying drawings, a storage device with error correction function and a controller with error correction function in a second preferred embodiment of the invention are described below.

The physical configuration of the storage device with error correction function in the second preferred embodiment is the same as that of the storage device with error correction function in the first preferred embodiment shown in FIG. 1. Therefore, the configuration that the information from the syndrome generation function part 111 of the plurality of memory I/F modules #A161 to #D164 is summarized in the correction register 115, and the error correction circuit 113 refers to the summarized information, and corrects errors sequentially, is the same as in the first preferred embodiment.

Figure 7:
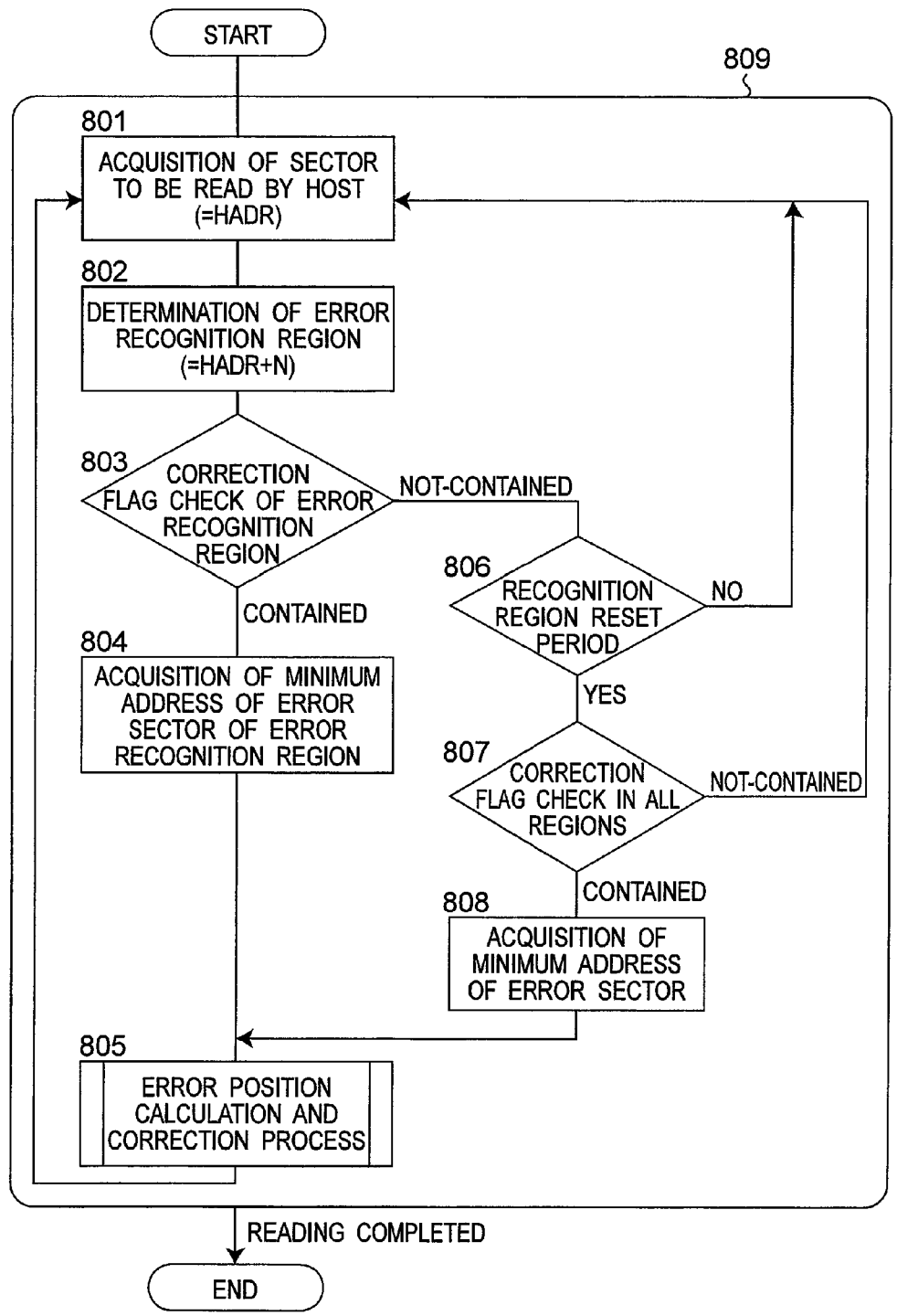
FIG. 7 is a flowchart of processing about error correction function of a controller in nonvolatile storage device in a second preferred embodiment of the invention.

In the second preferred embodiment, the processing flowchart about error correction function is different from that of the first preferred embodiment. FIG. 7 is a flowchart of processing about error correction function of a controller 102 in the nonvolatile storage device 101 in the second preferred embodiment of the invention. When reading out data from the nonvolatile storage device 101, the processing sequence judging circuit 114 recognizes the addresses of the transfer sector in the I/F of the nonvolatile memories #A131 to #D134, in addition to the address of the sectors issued from the host I/F 104. This is shown at step 806, and is specifically described subsequently.

First, at step 801, the processing sequence judging circuit 114 acquires the address of the sector being read by the host (this is supposed to be HADR). At next step 802, the error recognition region is determined. This is operated by the processing sequence judging circuit 114, in the same manner as at step 801, and the region of addresses adding n sectors to the data being read out to the host by way of the host I/F 104, that is, the region from HADR to HADR+n is determined. At next step 803, correction flag of the error recognition region is checked. Herein, the error correction circuit 113 checks the correction flag parts 116 in the correction register 115 corresponding to the range of error recognition region (HADR to HADR+n) noticed from the processing sequence judging circuit 114. If the correction flag parts 116 in the correction register 115 do not store information showing necessity of error correction, the operation goes to step 806. If the correction flag parts 116 in the correction register 115 store information showing necessity of error correction, the operation moves to step 804.

At step 804, a minimum address of error sector is acquired. That is, the error correction circuit 113 acquires the address of the sector of the smallest address, among the correction flag parts 116 in which storage of information showing necessity of error correction has been checked at step 803.

At next step 805, the error correction circuit 113 reads out syndrome corresponding to the address determined at step 804 from the syndrome part 108, and transfers to the error position detection circuit 112, which executes the calculation for determining the address of the bit having an error. The error position detection circuit 112 determines the address of the bit having an error on the basis of the transferred syndrome, and notices to the error correction circuit 113. In the error correction circuit 113, the data is read out from the data buffer 107 on the basis of the address of the bit having an error noticed by the error position detection circuit 112, the error is corrected, and the data is written back. Then the operation returns to step 801 for the next error correction.

On the other hand, as mentioned above, if the information showing necessity of error correction is not stored in the correction flag parts 116 in the correction register 115 at step 803, the operation goes to step 806, at which the processing sequence judging circuit 114 judges if the time of error recognition region reset period or not.

Figure 8:
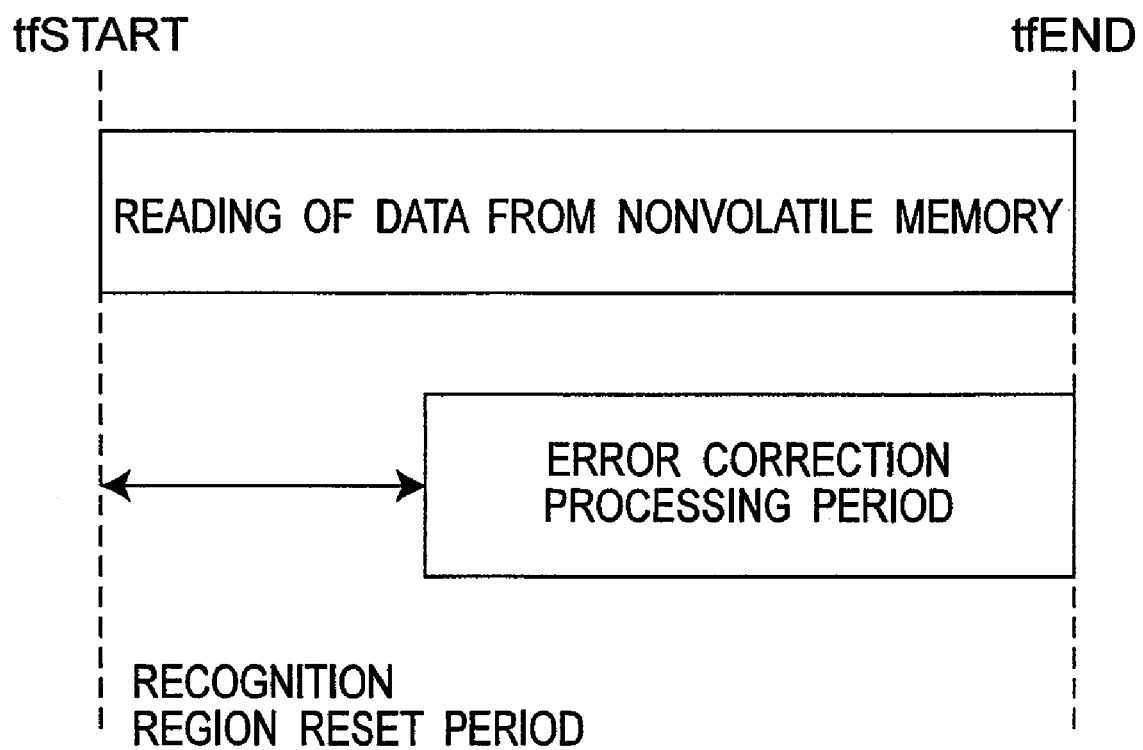
FIG. 8 is a diagram expressing the relation of error correction processing time and data transfer time to nonvolatile memory of nonvolatile storage device in the second preferred embodiment of the invention.
Figure 9:
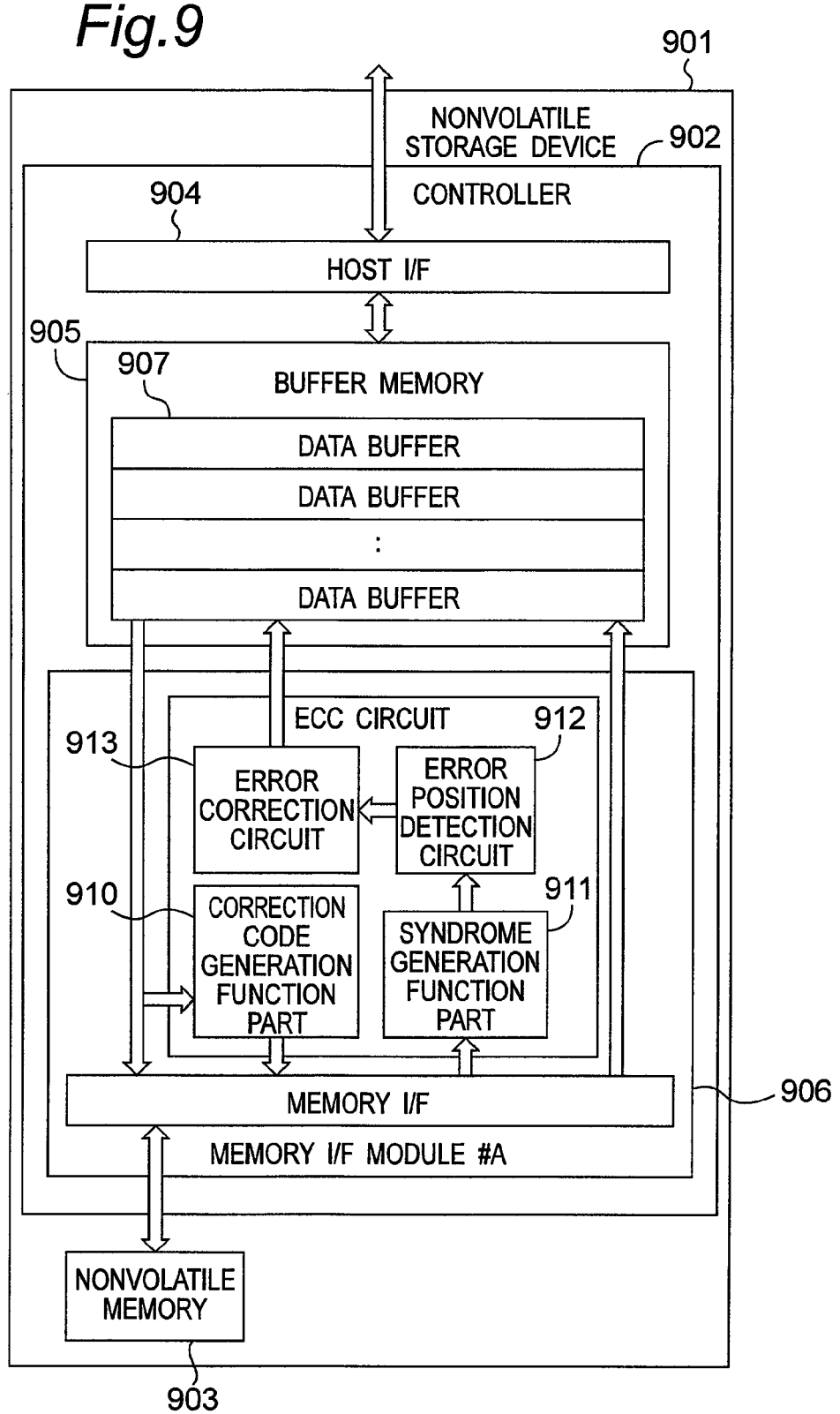
FIG. 9 is a block diagram of an example of nonvolatile storage device of a conventional storage device.
Figure 10:
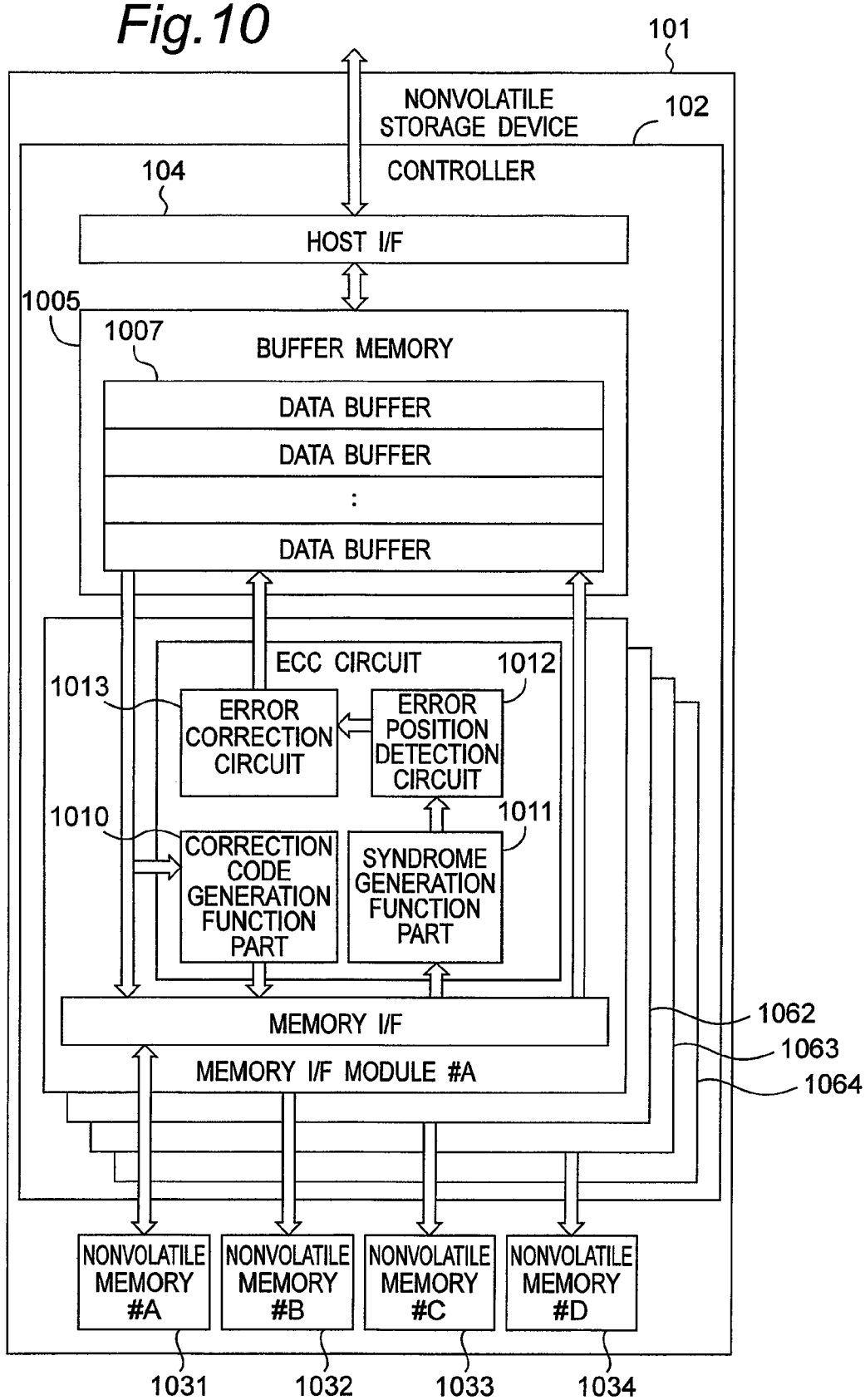
FIG. 10 is a block diagram of another example of nonvolatile storage device of a conventional storage device.

The error recognition region reset period above is explained by referring to FIG. 8. In FIG. 8, the start time of reading of certain sector data from (one) nonvolatile memory is expressed as tfSTART, and the end time of reading of sector data from the nonvolatile memory is expressed as tfEND. Herein, the object of recognition of reading of sector data from the nonvolatile memory is the data corresponding to the sector next to be read and issued to the host. The period from tfSTART to tfEND is the data reading time of one sector from the nonvolatile memory.

Suppose the time required for error correction process (error correction processing period) is shorter than the period from tfSTART to tfEND. Herein, the recognition region reset period is defined in a period starting from the data reading start time tfSTART from the nonvolatile memory, ending with the moment of subtracting the error correction processing period from data reading end time tfEND from the nonvolatile memory. When the error correction process is started within this recognition region reset period, the error correction process may be terminated before the end of data reading from the nonvolatile memory. That is, by starting the error correction process in the recognition region reset period when reading out the data of the sector next to be issued to the host from the nonvolatile memory, it does not cause a delay in the output of the data of the sector next to be issued to the host. Accordingly, it is important to finish error correction of the sector other than the recognition region preliminarily in this period. Incidentally, when starting error correction after the recognition region reset period, reading of data from the nonvolatile memory may be terminated before finishing of the error correction. That is, if there is an error in the sector having been read out, the error correction process of the corresponding sector data is started after waiting for the end of error correction process in action. In other words, the reading performance to the host will be lowered.

At step 806, the processing sequence judging circuit 114 judges if the time is an error recognition region reset period or not. If not an error recognition region reset period, the operation returns to step 801. In the case of an error recognition region reset period, it means that there is a chance to correct errors in the data of the preceding sector, and the processing sequence judging circuit 114 informs the error correction circuit 113 that it is the error recognition region reset period.

At this time, as shown from the flowchart, especially step 803, there is no error in the error recognition region (HADR to HADRR+n). Hence, at step 807, the error correction circuit 113 checks the correction flag parts 116 in all regions. If information showing necessity of error correction is not found, the operation returns to step 801. If information showing necessity of error correction is found, the operation goes to step 808. At step 808, the error correction circuit 113 acquires the address of the sector with the smallest address, among the correction flag parts 116 having been checked for storage of information showing necessity of error correction at step 807. Then the operation goes to step 805.

In the period of step group 809 consisting of steps 801 to 808, when reading from the nonvolatile storage device 101 is completed, the process is terminated.

As shown in the flowchart in FIG. 7, by installing the error recognition region reset period, the error correction processing of data in the section having an error can be executed without lowering the performance.

Other Preferred Embodiments

The invention is not applied to the nonvolatile memory alone, but may be also applied to a volatile memory having a configuration of data transfer in parallel by including a plurality of I/Fs. Further, the application is not limited to memories, and the invention may also be applied for a system which has a plurality of communication paths, for transmitting data and error correction codes corresponding thereto by way of these communication paths, and correcting errors.

The number of error correction circuit is not limited to one. On the basis of the principal concept of the invention, in the nonvolatile memory, the circuit scale may be curtailed by using a smaller number of error correction circuits than the number of syndrome generation function parts.

INDUSTRIAL APPLICABILITY

By making use of the invention, the circuit scale of the error correction circuit can be curtailed while maintaining the error correction capacity, and hence the invention is very useful in the storage device with error correction function aiming at lower cost and smaller space.

The invention claimed is:

1. A memory controller capable of controlling writing and reading of data in a plurality of memories, comprising:
   a plurality of interfaces provided individually corresponding to each one of the plurality of memories, for receiving sector data from the memories and error correction codes corresponding to the sector data,
   a plurality of syndrome generation circuits provided individually corresponding to each one of the plurality of interfaces, for generating syndromes on the basis of the received sector data and error correction codes, and
   an error correction circuit for, on the basis of the syndromes generated by the plurality of syndrome generation circuits, when any error is included in the sector data received by the plurality of interfaces, being responsible for scheduling of the correction sequence of a plurality of the second data, and for, in accordance with the scheduled sequence, correcting the plurality of the sector data received by the plurality of interfaces.

2. The memory controller of claim 1, wherein scheduling by the error correction circuit executes processing the sector data of the earlier address by priority among the sector data requiring error correction.

3. The memory controller of claim 2, wherein scheduling by the error correction circuit is applied only to the error correction of the sector data in a range of n sectors (n being an integer of 2 or larger).

4. The memory controller of claim 3, wherein the n sectors are determined on the basis of the time required for output of the data for the sector portion to outside of the memory controller, and the time required for error correction process of the sector section.

5. The memory controller of claim 3, wherein scheduling by the error correction circuit is intended to provide a period for setting the range for the error correction, and a period for not setting the range for the error correction.

6. The memory controller of claim 5, wherein the period for setting the range for the error correction, and the period for not setting are determined on the basis of the sector data reading time from the memory, and the error correction time.

7. A storage device with error correction function, comprising:
   a plurality of memories, and
   a memory controller of claim 1, capable of controlling writing and reading of data in the plurality of memories.

8. The storage device with error correction function of claim 7,
   wherein the memories are nonvolatile memories.

9. A system with error correction function, comprising:
   a storage device with error correction function of claim 7, and
   a host device for writing and reading data in the storage device.

\* \* \* \* \*